United States Patent
Peng et al.

(10) Patent No.: US 8,344,409 B2
(45) Date of Patent: Jan. 1, 2013

(54) OPTOELECTRONIC DEVICE AND METHOD FOR MANUFACTURING THE SAME

(75) Inventors: Wei-Chih Peng, Hsinchu (TW); Ta-Cheng Hsu, Hsinchu (TW); Yu-Jiun Shen, Hsinchu (TW); Ching-Fu Tsai, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/178,323

(22) Filed: Jul. 7, 2011

(65) Prior Publication Data

US 2012/0104440 A1    May 3, 2012

(30) Foreign Application Priority Data

Oct. 29, 2010 (TW) .................. 99137445 A
Jan. 19, 2011 (TW) .................. 00102057 A

(51) Int. Cl.
*H01L 33/00* (2010.01)

(52) U.S. Cl. .......................................... 257/98; 257/288

(58) Field of Classification Search ............... 257/288, 257/292, 98, E25.032
See application file for complete search history.

(56) References Cited

U.S. PATENT DOCUMENTS

| | | | | |
|---|---|---|---|---|
| 5,526,449 | A * | 6/1996 | Meade et al. | 385/14 |
| 6,918,946 | B2 * | 7/2005 | Korgel et al. | 75/362 |
| 7,567,342 | B2 * | 7/2009 | Reinhold et al. | 356/71 |
| 8,123,859 | B2 * | 2/2012 | Schowalter et al. | 117/89 |
| 8,248,305 | B2 * | 8/2012 | Curran et al. | 343/700 MS |
| 2009/0278233 | A1 * | 11/2009 | Pinnington et al. | 257/615 |
| 2010/0047522 | A1 * | 2/2010 | Sivarajan et al. | 428/143 |
| 2010/0135937 | A1 * | 6/2010 | O'Brien et al. | 424/59 |
| 2010/0278720 | A1 * | 11/2010 | Wong et al. | 423/604 |
| 2011/0095342 | A1 * | 4/2011 | Daniel et al. | 257/288 |
| 2012/0132930 | A1 * | 5/2012 | Young et al. | 257/84 |

* cited by examiner

*Primary Examiner* — Thao P. Le
(74) *Attorney, Agent, or Firm* — Muncy, Geissler, Olds & Lowe, PLLC

(57) ABSTRACT

An optoelectronic device comprising, a substrate and a first transition stack formed on the substrate comprising a first transition layer formed on the substrate having a hollow component formed inside the first transition layer, a second transition layer formed on the first transition layer, and a reflector rod formed inside the second transition layer.

20 Claims, 11 Drawing Sheets

OPTOELECTRONIC DEVICE AND METHOD FOR MANUFACTURING THE SAME

RELATED APPLICATION

This application claims the priority to and the benefit of TW application Ser. No. 099137445 filed on Oct. 29, 2010 and TW application Ser. No. 100102057 filed on Jan. 19, 2011; the contents of which are incorporated herein by reference in their entirety.

BACKGROUND

1. Technical Field

The present disclosure relates to an optoelectronic device having a transition stack formed between the semiconductor layer and the substrate.

2. Description of the Related Art

The light radiation theory of light emitting diode (LED) is to generate light from the energy released by the electron moving between an n-type semiconductor and a p-type semiconductor. Because the light radiation theory of LED is different from the incandescent light which heats the filament, the LED is called a "cold" light source. Moreover, the LED is more sustainable, longevous, light and handy, and less power consumption, therefore it is considered as a new light source for the illumination markets. The LED applies to various applications like the traffic signal, backlight module, street light, and medical instruments, and is gradually replacing the traditional lighting sources.

Generally, the light extraction efficiency depends on the internal quantum efficiency and light extraction efficiency. The internal quantum efficiency can be defined as opto-electrical conversion efficiency in the LED.

FIG. 5A illustrates the structure of a conventional light emitting device 10 which includes a transparent substrate 10, a buffer layer 11, a semiconductor stack layer 12 formed above the transparent substrate 10, and an electrode 14 formed above the semiconductor stack layer 12, wherein the semiconductor stack layer 12 comprises, from the top, a first conductive-type semiconductor layer 120, an active layer 122, and a second conductive-type semiconductor layer 124. At least one void 111 is formed inside the buffer layer 11.

However, as shown in the FIG. 5B, the conventional light emitting device 100 is with a gray surface because of the void 111 inside the buffer layer 11, and the light transmission is decreased.

SUMMARY OF THE DISCLOSURE

An optoelectronic device comprising, a substrate and a first transition stack formed on the substrate comprising a first transition layer formed on the substrate having a hollow component formed inside the first transition layer, a second transition layer formed on the first transition layer, and a reflector rod formed inside the second transition layer.

BRIEF DESCRIPTION OF DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE PREFERRED EMBODIMENTS

Figure 1A:
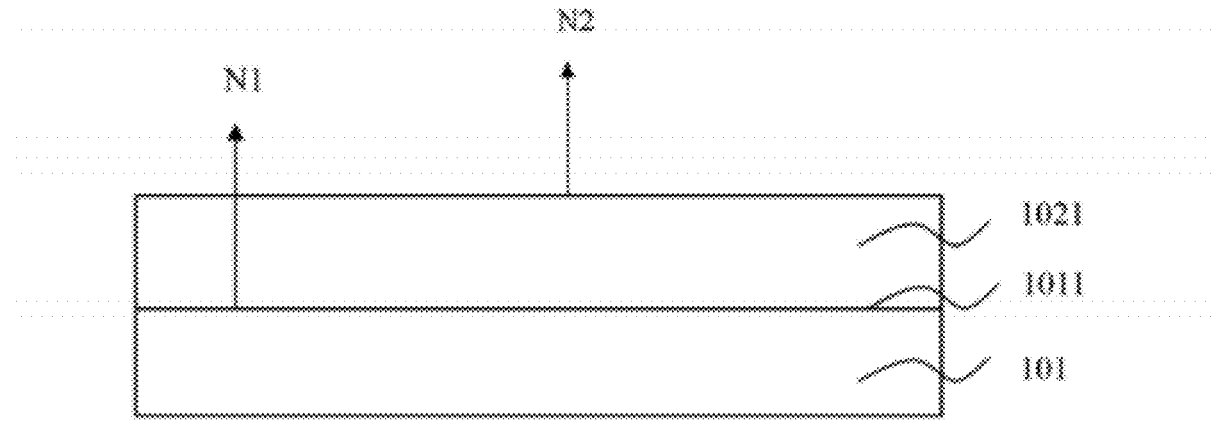
FIGS. 1A-1B and 1D-1G illustrate a process flow of a method of fabricating an optoelectronic device of the first embodiment in the present disclosure

Reference is made in detail to the preferred embodiments of the present application, examples of which are illustrated in the accompanying drawings. Wherever possible, the same reference numbers are used in the drawings and the description to refer to the same or like parts.

The present disclosure describes an optoelectronic device and a method of fabricating the optoelectronic device. In order to have a thorough understanding of the present disclosure, please refer to the following description and the illustrations of FIG. 1A to FIG. 5B.

FIGS. 1A to 1F illustrate a process flow of the method of fabricating the optoelectronic device of first embodiment of the present disclosure. FIG. 1A shows a substrate 101 having a normal line direction N1 and a first major surface 1011. A first transition layer 1021 formed on the first surface 1011 of the substrate 101 having a normal line direction N2 wherein the thickness of the first transition layer 1021 can be 0.3-3 µm, 0.4-3 µm, 0.5-3 µm, 0.7-3 µm, 1-3 µm or 2-3 µm.

In this embodiment, the material of the first transition layer 1021 contains at least one element selected from the group consisting of Al, Ga, In, As, P, and N, such as GaN or AlGaInP. In one embodiment, the first transition layer 1021 can be an n-type doped layer; the doping concentration can be $1E15$-$1E19$ $cm^{-3}$, $1E16$-$1E19$ $cm^{-3}$, $1E17$-$1E19$ $cm^{-3}$, $1E18$-$1E19$ cm-3, $5\times1E18$-$1E19$ cm-3, $5\times1E17$-$1E19$ cm-3, or $5\times1E17$-$1E18$ cm-3.

Figure 1B:
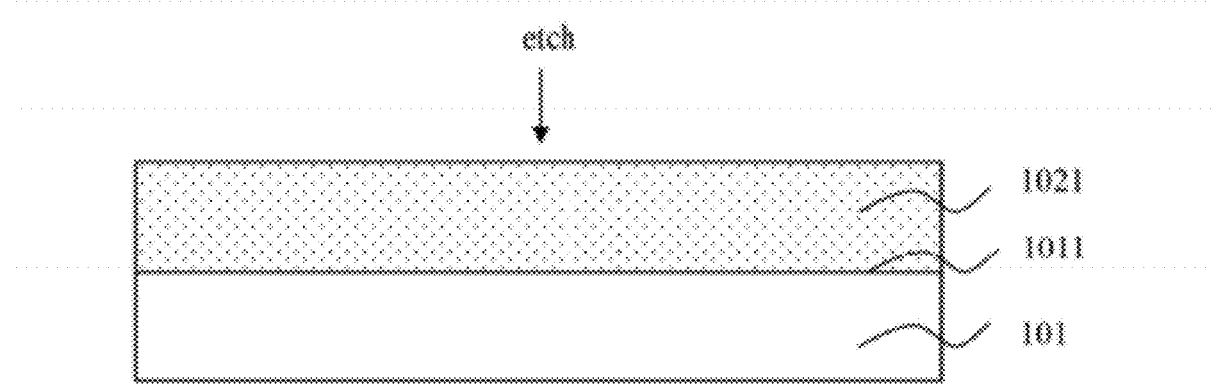

Following, as FIG. 1B shows, the first transition layer 1021 can be etched by the following method to form at least one hollow component such as pore, void, bore, pinhole, cavity, or at least two hollow components that can link into a mesh or porous structure.

The methods include: 1) Wet etching with an aqueous solution of at least one of $H_2SO_4$, $H_3PO_4$, $H_2C_2O_4$, HCl, KOH, and NaOH, ethylene glycol solution or their mixture;

2) Electrochemical etching with an aqueous solution of at least one of $H_2SO_4$, $H_3PO_4$, $H_2C_2O_4$, HCl, KOH, and NaOH, an ethylene glycol solution or their mixture; or 3) Dry etching such as inductive coupling plasma (ICP), reactive ion etch (RIE) by a gas containing at least one of HCl, $Cl_2$, $SF_6$, $H_2$, $BCl_3$ and $CH_4$.

Figure 1C:
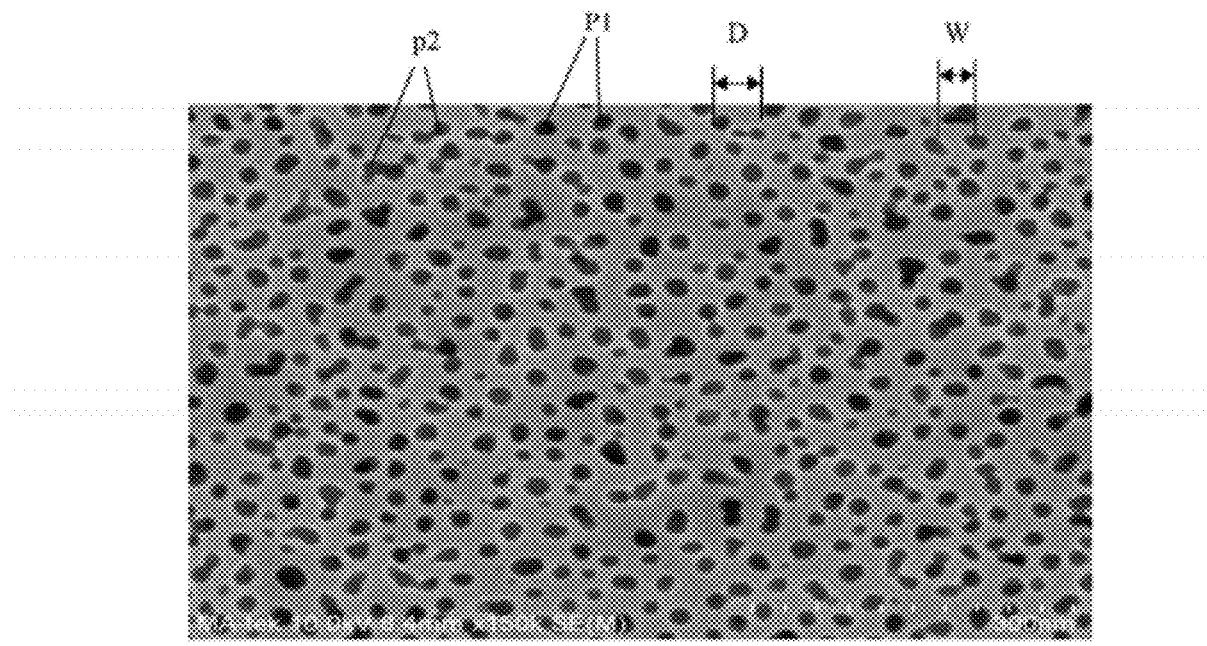
FIGS. 1C and 1H illustrate scanning electron microscope (SEM) pictures of the first embodiment in the present disclosure.

FIG. 1C illustrates a scanning electron microscope (SEM) picture of the first embodiment of the present disclosure which shows the top view of the first transition layer 1021. The first transition layer 1021 has a plurality of hollow components p1 or a plurality of mesh or porous structure p2 formed inside the first transition layer 1021 wherein the plurality of hollow components p1 can have the same or different width W.

In this embodiment, the width W of the hollow component is defined as the largest size of the hollow component p1 perpendicular with the normal line direction N2 of the first transition layer 1021. The width W of the hollow component p1 inside the first transition layer 1021 can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm. In one embodiment, the width W of the hollow component p1 close to the substrate is larger than the width of the hollow component p1 close to the second transition layer 1022.

The average distance D of the plurality of hollow component p1 can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm.

In another embodiment, the plurality of hollow component p1 inside the first transition layer 1021 forms a regular array structure. The average width W of the plurality of hollow component p1 can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm.

The porosity $\Phi$ of the plurality of the hollow component p1 is defined as the total volume of the hollow component $V_V$ divided by the overall volume $V_T$ of the first transition layer 1021

$$\left(\phi = \frac{V_V}{V_T}\right).$$

In this embodiment, the porosity $\Phi$ can be 5%-90%, 10%-90%, 20%-90%, 30%-90%, 40%-90%, 50%-90%, 60%-90%, 70%-90% or 80%-90%.

Figure 1D:
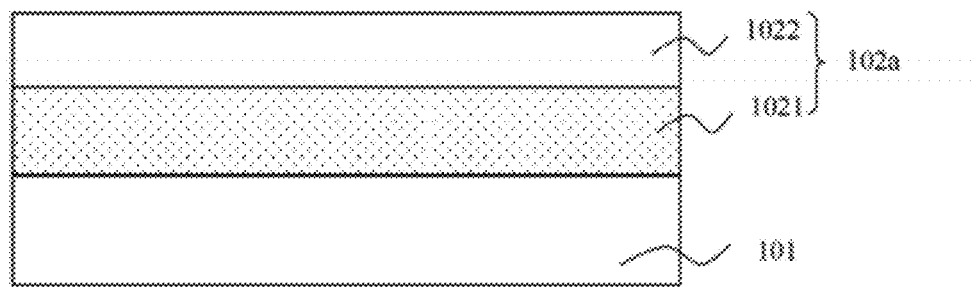

Following, as FIG. 1D shows, a second transition layer 1022 is formed on the first transition layer 1021 wherein the first transition layer 1021 and the second transition layer 1022 form a first transition stack 102a. The growing temperature of the second transition layer 1022 can be 800-1200° C., and the pressure can be 100-700 mbar, wherein the adjustment of the growing condition is based on the porosity and volume of the hollow component of the first transition layer 1021. The second transition layer 1022 is laterally grown and coalesced on the first transition layer 1021 by decreasing the volume of the hollow component between the interface of the first transition layer 1021 and the second transition layer 1022 and continues to grow vertically. In one embodiment, the second transition layer 1022 is an unintentional doped layer or an undoped layer.

Figure 1E:
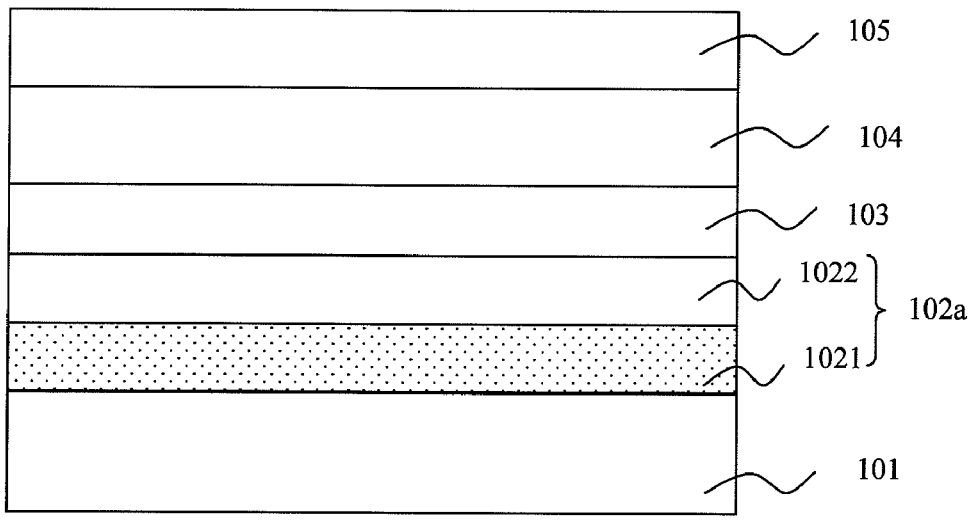
Figure 1F:
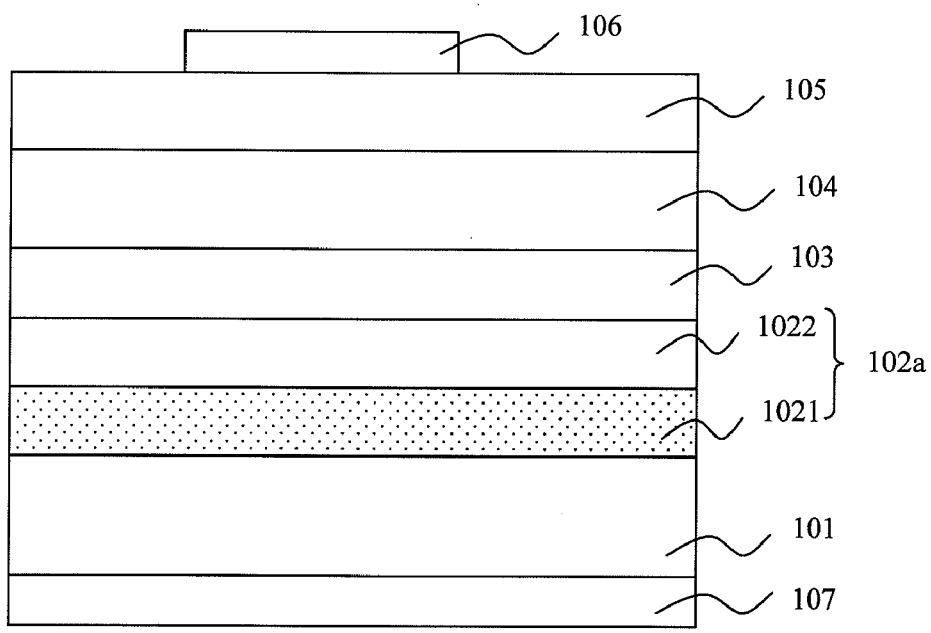

Following, as FIG. 1E shows, a first conductivity semiconductor layer 103, an active layer 104 and a second conductivity semiconductor layer 105 are formed on the second transition layer 1022 subsequently. Finally, as shown in FIG. 1F, two electrodes 106, 107 are formed on the second conductivity semiconductor layer 105 and the substrate 101 respectively to form a vertical type optoelectronic device 100.

Figure 1G:
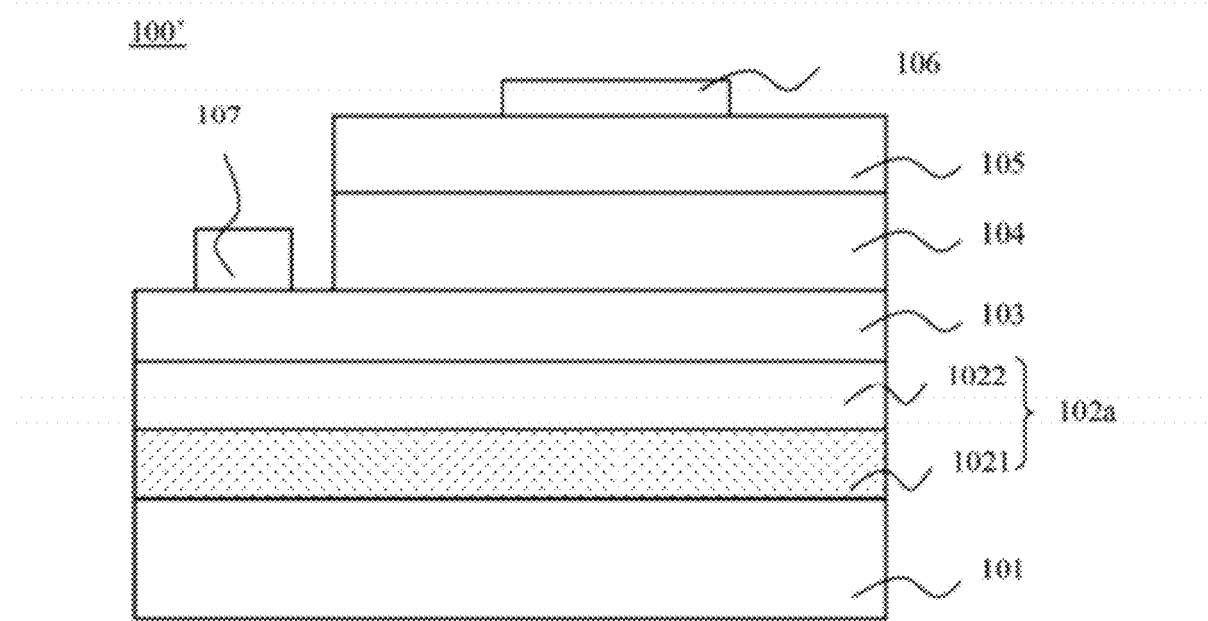

In one embodiment, as shown in FIG. 1G, partial of the active layer 104 and the second conductivity semiconductor layer 105 is etched to expose partial of the first conductivity semiconductor layer 103. Two electrodes 106, 107 are formed on the second conductivity semiconductor layer 105 and the first conductivity semiconductor layer 103 respectively to form a horizontal type optoelectronic device 100'. The material of the electrode 106, 107 can be Cr, Ti, Ni, Pt, Cu, Au, Al or Ag.

In one embodiment, the optoelectronic device 100' can be bonded on a submount to form a flip-chip structure.

Figure 1H:
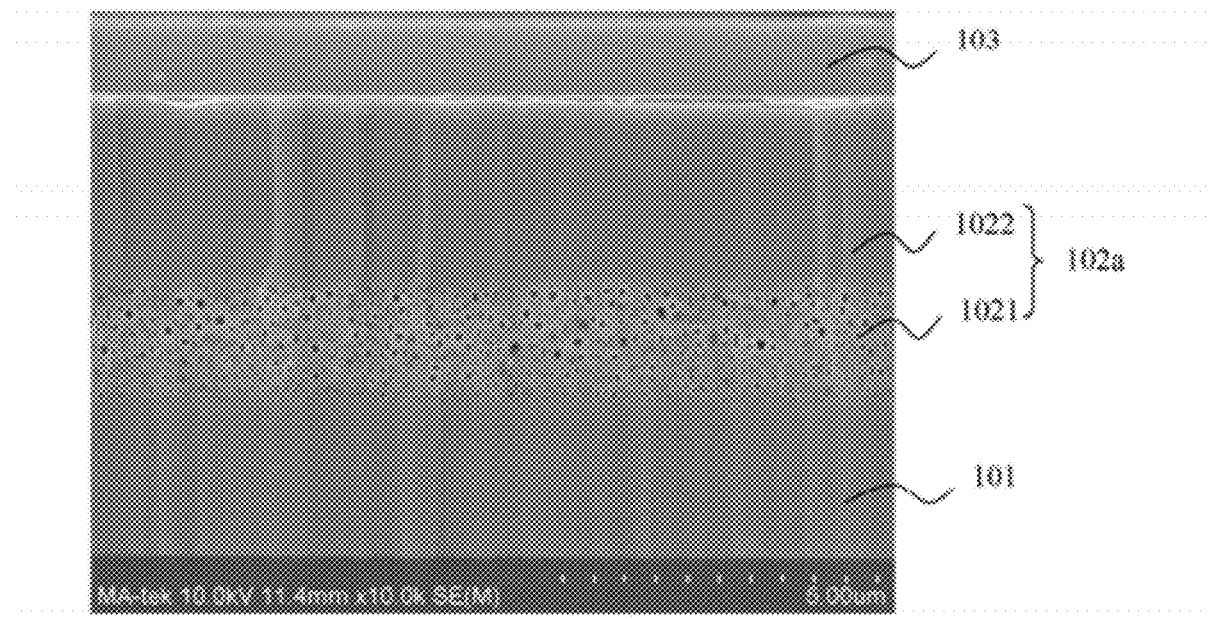

FIG. 1H illustrates a scanning electron microscope (SEM) picture of the first embodiment of the present disclosure which shows the substrate 101, the first transition layer 1021, the second transition layer 1022 and the first conductivity semiconductor layer 103. In one embodiment, the width W of the hollow component inside the first transition layer 1021 is decreased along the direction from the substrate 101 to the second transition layer 1022.

The plurality of the hollow component inside the first transition layer 1021 having a refractive index. Because of the difference of the refractive index of the plurality of the hollow component and the semiconductor layer, for example, the refractive index of the semiconductor layer is 2-3, and the refractive index of air is 1 so the light transmitting into the plurality of the hollow component changes its emitting direction to outside the optoelectronic device and increases the light emitting efficiency. Besides, the plurality of the hollow component can be a scattering center to change the direction of the photon and decrease the total reflection. By increasing the porosity of the hollow component, the effect mentioned above is increasing.

The second transition layer 1022 can be an unintentional doped layer or an undoped layer. The second transition layer 1022 is laterally grown and coalesced on the first transition layer 1021 by decreasing the volume of the hollow component formed between the interfaces of the first transition layer 1021 and the second transition layer 1022 and continues to epitaxial grow vertically. The second transition layer 1022 can avoid the absorption of the doping material such as Si or Mg into the hollow component from the doped n-type or p-type semiconductor layer, and the transmittance and the light extraction efficiency is therefore increased.

Figure 2A:
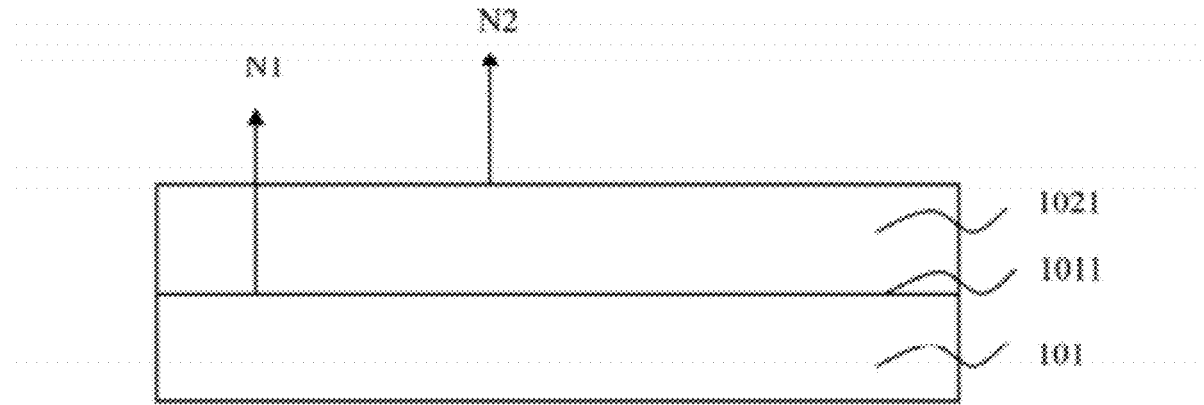
FIGS. 2A-2C and 2E-2I illustrate a process flow of a method of fabricating an optoelectronic device of the second embodiment in the present disclosure.

FIGS. 2A-2C, 2E-2I illustrate a process flow of a method of fabricating an optoelectronic device of the second embodiment in the present disclosure. As FIG. 2A shows, a substrate 101 having a normal line direction N1 and a first major surface 1011. A first transition layer 1021 formed on the first surface 1011 of the substrate 101 having a normal line direction N2 wherein the thickness of the first transition layer 1021 can be 0.3-3 μm, 0.4-3 μm, 0.5-3 μm, 0.7-3 μm, 1-3 μm or 2-3 μm.

In this embodiment, the material of the first transition layer 1021 contains at least one element selected from the group consisting of Al, Ga, In, As, P, and N, such as GaN or AlGaInP. In one embodiment, the first transition layer 1021 can be an n-type layer; the doping concentration can be 1E15-1E19 $cm^{-3}$, 1E16-1E19 $cm^{-3}$, 1E17-1E19 $cm^{-3}$, 1E18-1E19 $cm^{-3}$, 5×1E18-1E19 $cm^{-3}$, 5×1E17-1E19 $cm^{-3}$, or 5×1E17-1E18 $cm^{-3}$.

Figure 2B:
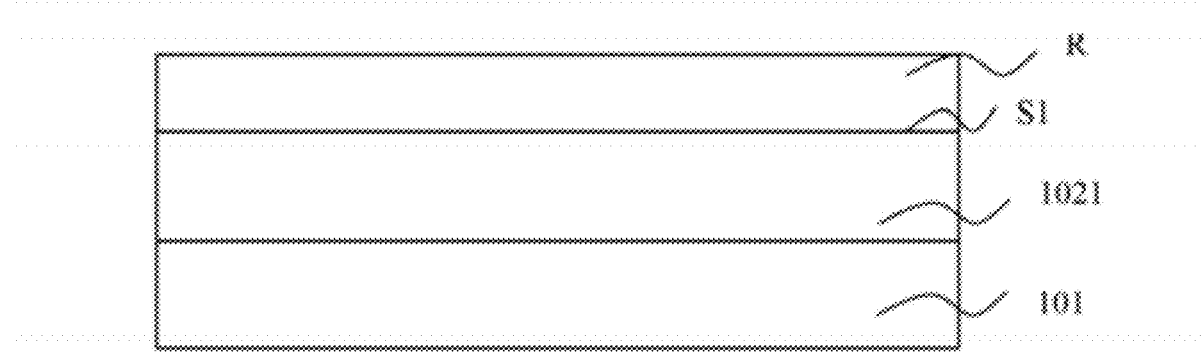
Figure 2C:
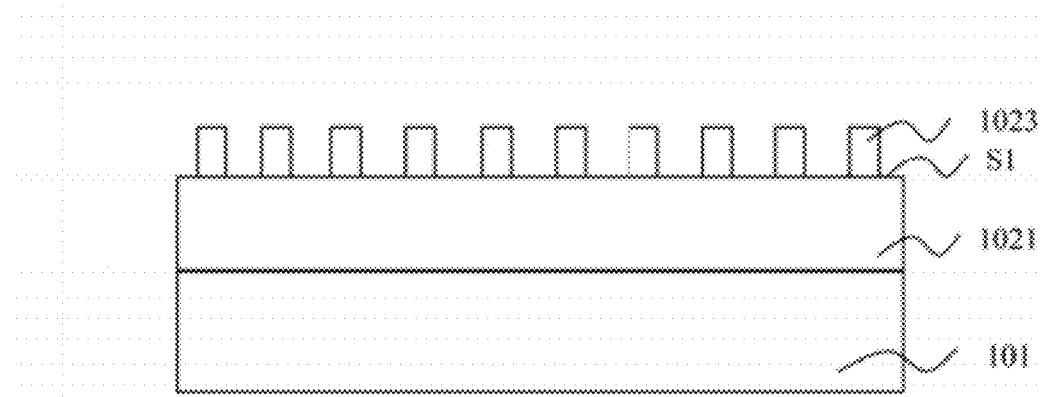
Figure 2D:
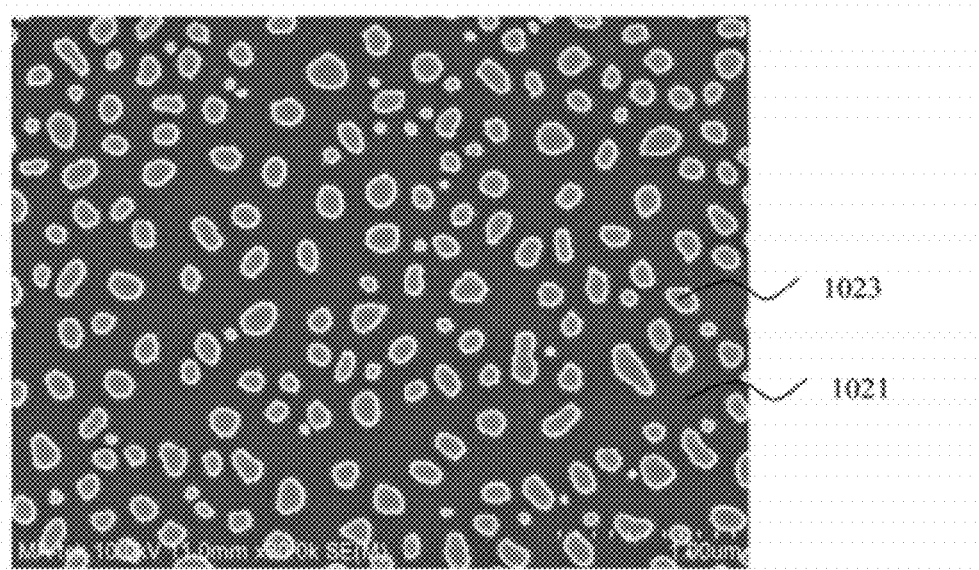
FIG. 2D illustrates a scanning electron microscope (SEM) picture of the top view of the second embodiment in the present disclosure.

Following, as FIG. 2B shows, a reflecting layer R formed on the first surface S1 of the first transition layer 1021. As FIG. 2C shows, a plurality of reflector rod 1023 is formed on the first surface S1 of the first transition layer 1021 by etching partial of the reflector layer. FIG. 2D illustrates a scanning electron microscope (SEM) picture of the top view of the first transition layer 1021. In this embodiment, the plurality of reflector rod 1023 can be arranged on the first surface S1 of the first transition layer 1021 irregularly. The material of the reflector layer R and the plurality of the reflector rod 1023 can be non-crystalline material such as ITO, ZnO, nitrides or oxides of Si, Ti, Ta, Zr and the like or composite material of nitrides or oxides of Si, Ti, Ta, Zr and the like. The height of the plurality of the reflector rod 1023 can be 30-300 nm, 50-300 nm, 100-300 nm or 200-300 nm. The width of the plurality of the reflector rod 1023 can be 0.1-10 μm, 0.3-10 μm, 0.5-10 μm, 1-10 μm, 3-10 μm or 5-10 μm. The cover ratio of the plurality of the reflector rod 1023 on the first surface of the first transition layer 1021 can be 20%-60%, 30%-60%, 40%-60% or 50%-60%.

Figure 2E:
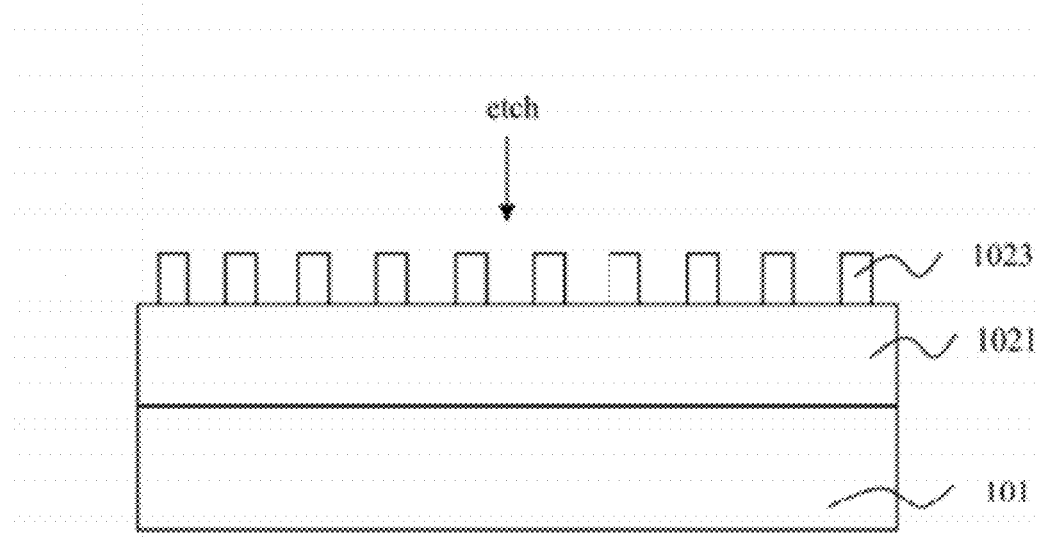

As FIG. 2E shows, the first transition layer 1021 can then be etched by the following method to form at least one hollow component such as pore, void, bore, pinhole, cavity, or at least two hollow components that can link into a mesh or porous structure.

The methods include: 1) Wet etching with an aqueous solution of at least one of $H_2SO_4$, $H_3PO_4$, $H_2C_2O_4$, HCl, KOH, and NaOH, ethylene glycol solution or their mixture;

2) Electrochemical etching with an aqueous solution of at least one of $H_2SO_4$, $H_3PO_4$, $H_2C_2O_4$, HCl, KOH, and NaOH, an ethylene glycol solution or their mixture; or 3) Dry etching such as inductive coupling plasma (ICP), reactive ion etch (RIE) by a gas containing at least one of HCl, $Cl_2$, $SF_6$, $H_2$, $BCl_3$ and $CH_4$.

Figure 2F:
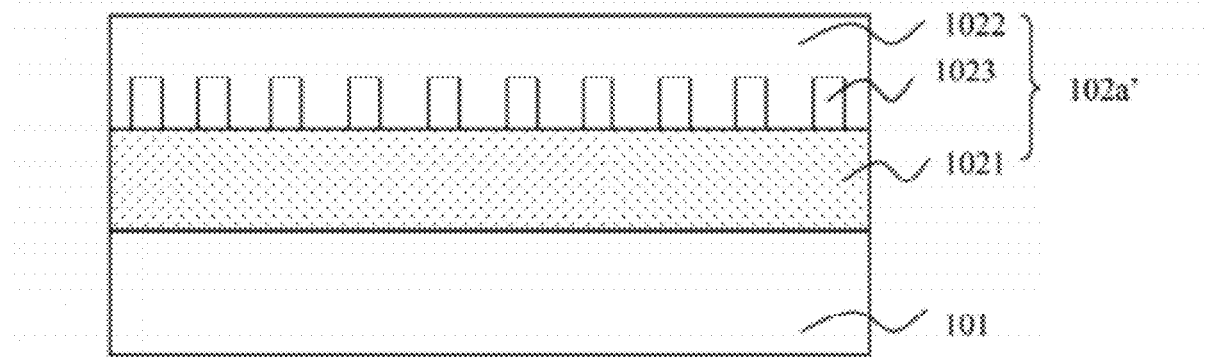

Following, as FIG. 2F shows, a second transition layer 1022 is formed on the first transition layer 1021 and covers the plurality of reflector rod 1023 wherein the first transition layer 1021, the plurality of reflector rod 1023 and the second transition layer 1022 form a first transition stack 102a'. The growing temperature of the second transition layer 1022 can be 800-1200° C. and the pressure can be 100-700 mbar wherein the adjustment of the growing condition is based on the porosity and volume of the hollow component of the first transition layer 1021. In one embodiment, the second transition layer 1022 is an unintentional doped layer or an undoped layer.

The second transition layer 1022 is laterally grown and coalesced on the first transition layer 1021 by decreasing the volume of the hollow component formed between the interface of the first transition layer 1021 and the second transition layer 1022, covers the plurality of reflector rod 1023, and continues to grow vertically. The reflector rod 1023 can increase the light emitting efficiency by reflecting the emitted light. By forming the plurality of the reflector rod 1023, the lattice mismatch defect of the first transition layer 1021 can also be decreased. Besides, by utilizing the lateral growth of the second transition layer 1022, a high-quality layer with less crystal defects such as threading dislocations is formed, and the manufacturing yield, characteristics and reliability of the optoelectronic device can be greatly enhanced.

In one embodiment, the first transition layer 1021 has a plurality of hollow components formed inside the first transition layer 1021 wherein the plurality of hollow components can have the same or different width.

In this embodiment, the width of the hollow component is defined as the largest size of the hollow component perpendicular with the normal line direction N2 of the first transition layer 1021. The width of the hollow component inside the first transition layer 1021 can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm. In one embodiment, the width of the hollow component close to the substrate is larger than the width of the hollow component close to the second transition layer 1022. In one embodiment, the width of the hollow component inside the first transition layer 1021 is decreased along the direction from the substrate to the second transition layer 1022.

The average distance of the plurality of hollow component can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm.

In another embodiment, the plurality of hollow component inside the first transition layer 1021 forms a regular array structure. The average width of the plurality of hollow component can be 10 nm-2000 nm, 100 nm-2000 nm, 300 nm-2000 nm, 500 nm-2000 nm, 800 nm-2000 nm, 1000 nm-2000 nm, 1300 nm-2000 nm, 1500 nm-2000 nm, or 1800 nm-2000 nm. The porosity Φ of the plurality of the hollow component is defined as the total volume of the hollow component $V_V$ divided by the overall volume $V_T$ of the first transition layer 1021

$$\left(\phi = \frac{V_V}{V_T}\right).$$

In this embodiment, the porosity Φ can be 5%-90%, 10%-90%, 20%-90%, 30%-90%, 40%-90%, 50%-90%, 60%-90%, 70%-90% or 80%-90%.

Figure 2G:
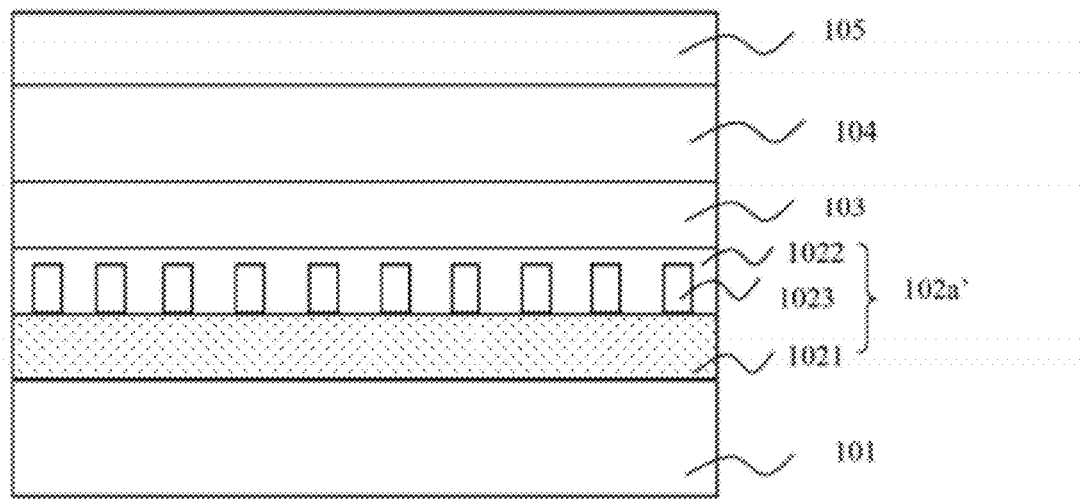
Figure 2H:
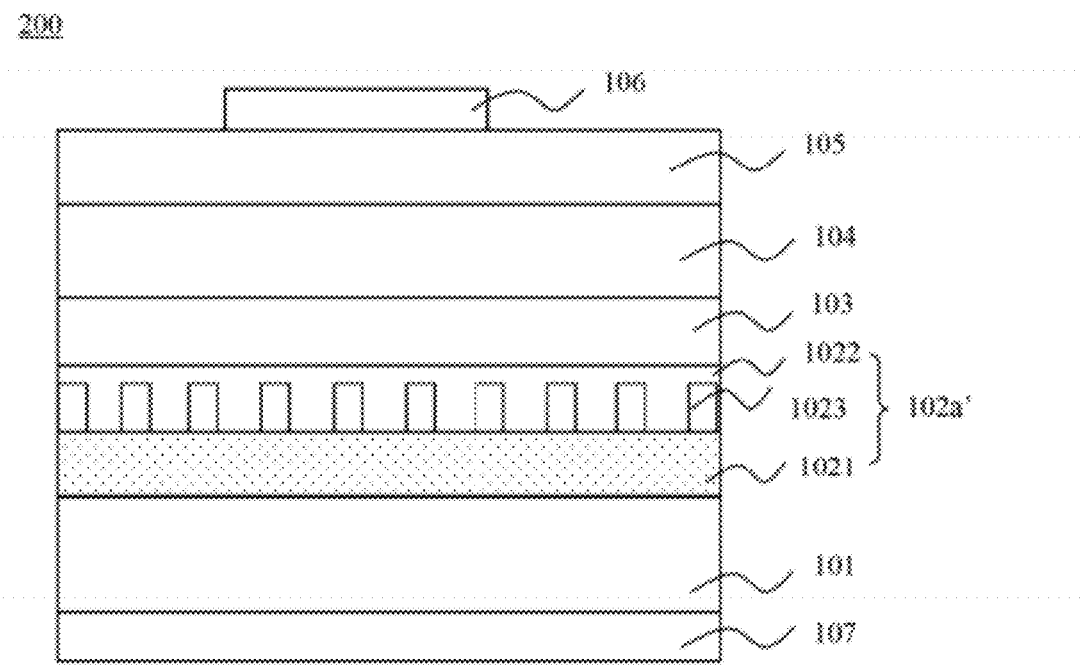

Following, as FIG. 2G shows, a first conductivity semiconductor layer 103, an active layer 104 and a second conductivity semiconductor layer 105 are formed on the second transition layer 1022 subsequently. As FIG. 2H shows, two electrodes 106, 107 are formed on the second conductivity semiconductor layer 105 and the substrate 101 respectively to form a vertical type optoelectronic device 200.

Figure 2I:
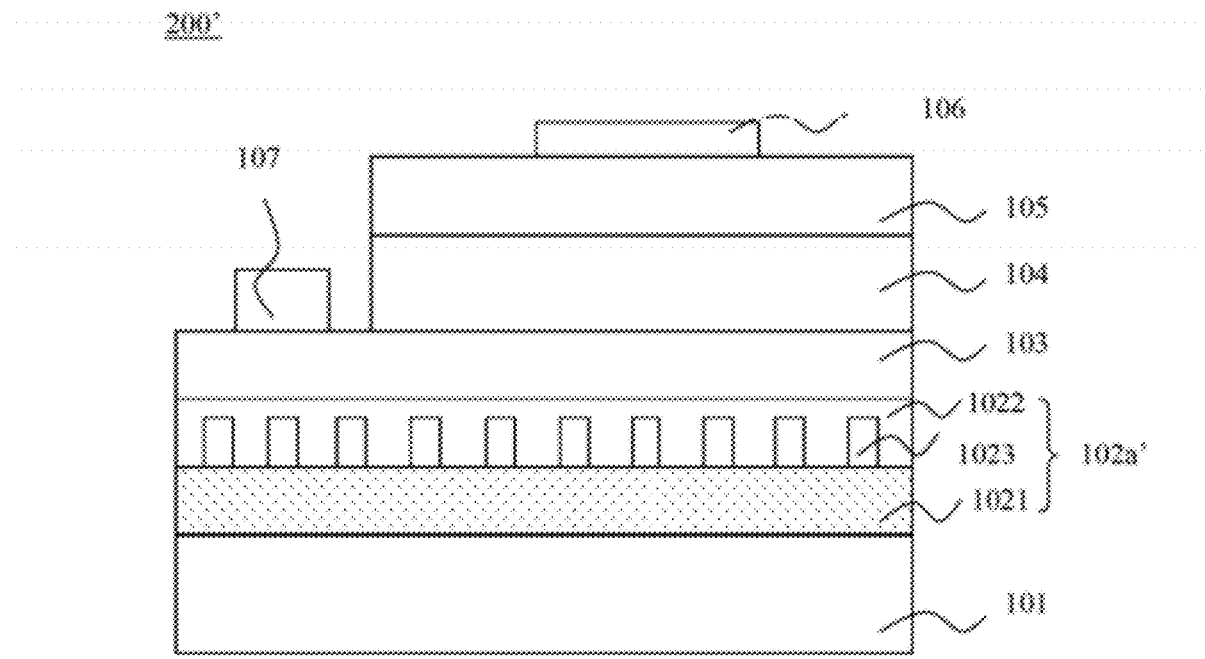

In one embodiment, as FIG. 2I shows, partial of the active layer 104 and the second conductivity semiconductor layer 105 is etched to expose partial of the first conductivity semiconductor layer 103. Two electrodes 106, 107 are formed on the second conductivity semiconductor layer 105 and the first conductivity semiconductor layer 103 respectively to form a horizontal type optoelectronic device 200'. The material of the electrode 106, 107 can be Cr, Ti, Ni, Pt, Cu, Au, Al or Ag.

The plurality of the hollow component inside the first transition layer 1021 having a refractive index. Because of the difference of the refractive index of the plurality of the hollow component and the semiconductor layer, for example, the refractive index of the semiconductor layer is 2-3, and the refractive index of air is 1 so the light transmitting into the plurality of the hollow component changes its direction and emits outside the optoelectronic device so the light emitting efficiency is increased. Besides, the plurality of the hollow component can be a scattering center to change the direction of the photon and decrease the total reflection. By increasing the porosity of the hollow component, the effect mentioned above is increasing.

The second transition layer 1022 can be an unintentional doped layer or an undoped layer. The second transition layer 1022 is laterally grown and coalesced on the first transition layer 1021 by decreasing the volume of the hollow component formed between the interface of the first transition layer 1021 and the second transition layer 1022 and continues to epitaxial grow vertically. The second transition layer 1022 can avoid the absorption of the doping material such as Si or Mg into the hollow component from the doped n-type or p-type semiconductor layer. By decreasing the absorption of the doping material, the transmittance and the light extraction efficiency is increased.

Figure 3:
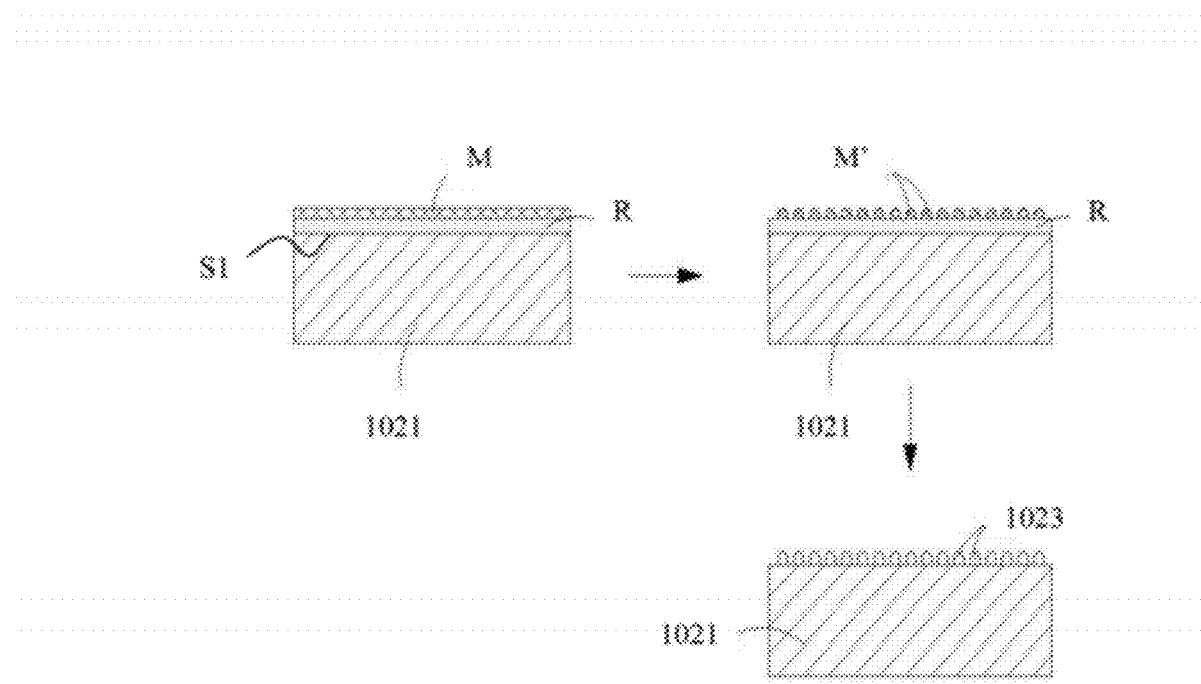
FIG. 3 schematically illustrates a fabricating process of the plurality of the reflector rod in accordance with another embodiment of the present disclosure.

FIG. 3 schematically illustrates a fabricating process of the plurality of the reflector rod in accordance with another embodiment of the present disclosure. Referring to FIG. 3, a reflector layer R is formed on the first surface S1 of the first transition layer 1021. A metal layer M is then formed on the reflector layer R. A material of the metal layer M can be nickel or gold. A thickness of the metal layer M is in a range from 50 angstroms to 200 angstroms. A thermal treatment is applied to the metal layer M so that a plurality of nanoscale metal particles M' is formed. A temperature of the thermal treatment is approximately 850° C. Next, an etching process is performed. In the etching process, the nanoscale metal particles M' is used as a mask. The etching process is, for example, inductively-coupled plasma reactive ion etching (ICP-RIE). Next, an acid etching process is performed. For example, the first transition layer 1021 is put into a nitric acid etching solution at 100° C. so as to remove the remaining nanoscale metal particles M'. As a result, the reflector layer R is transformed to a plurality of reflector rod 1023. In one embodiment, the plurality of reflector rod 1023 can be formed on the first transition layer 1021 irregularly.

Figure 4A:
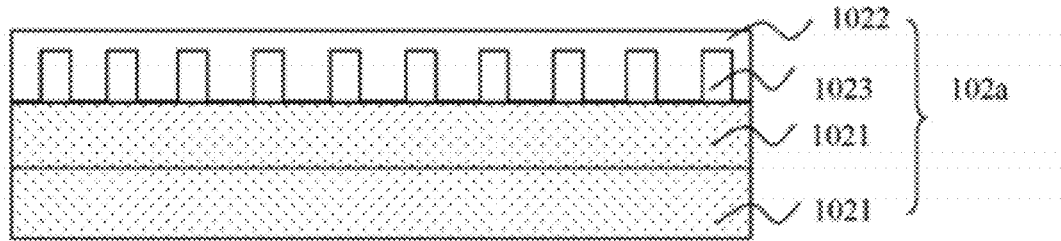
FIGS. 4A-4C illustrate the structure of another optoelectronic device of the third embodiment in the present disclosure.
Figure 4B:
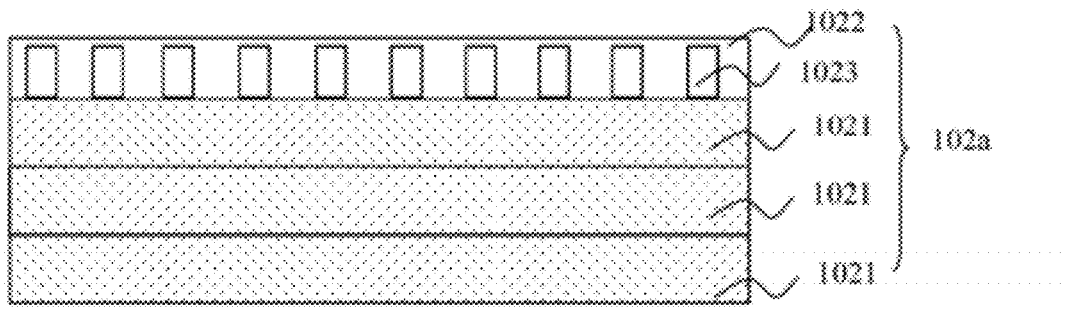
Figure 4C:
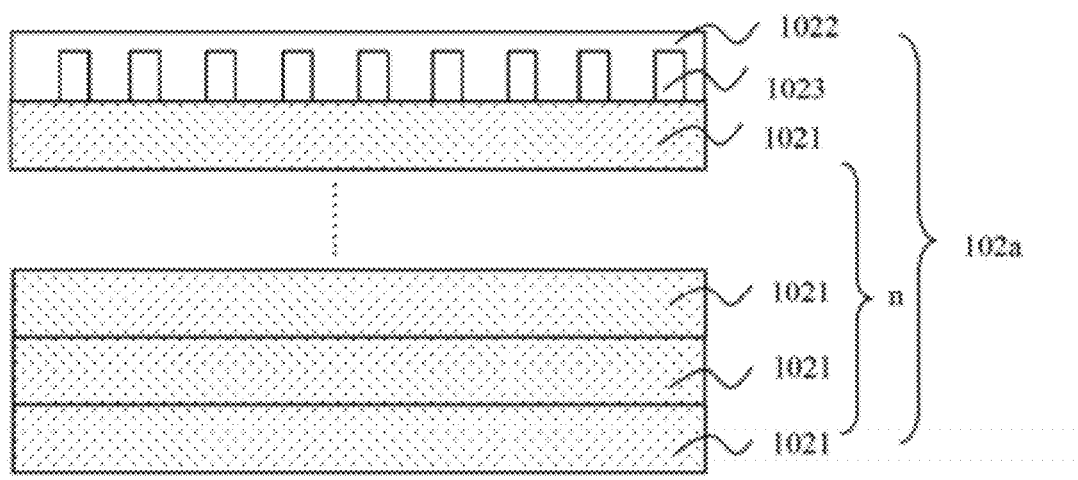
Figure 5A:
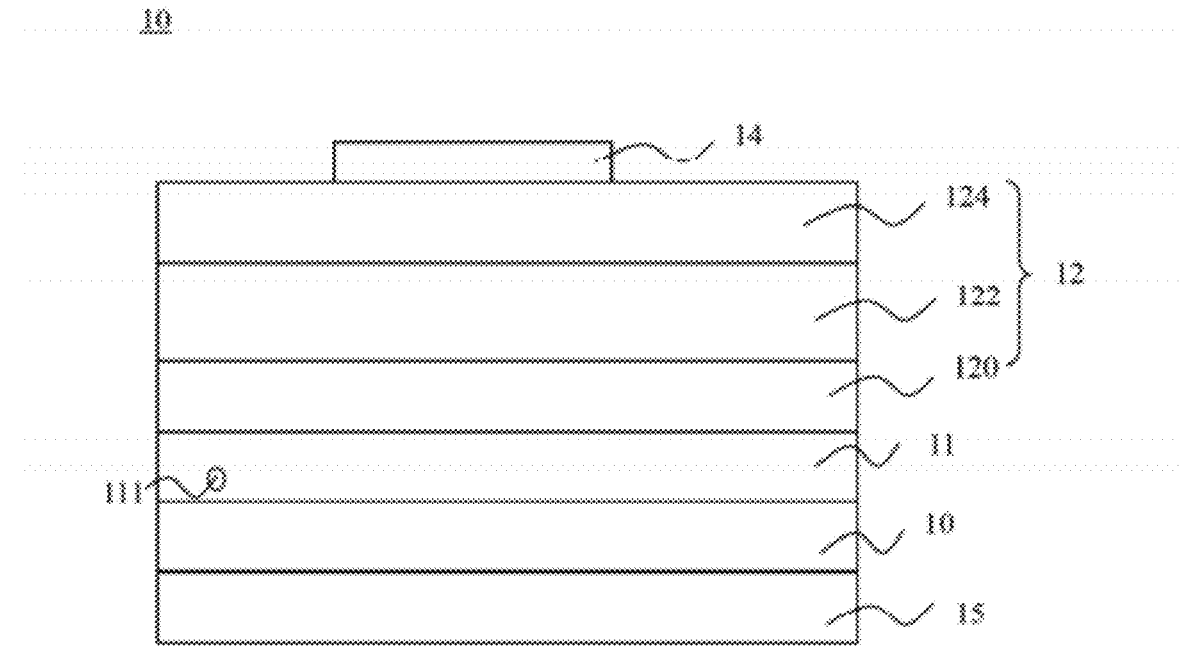
FIG. 5A illustrates the structure of a conventional light emitting device.
Figure 5B:
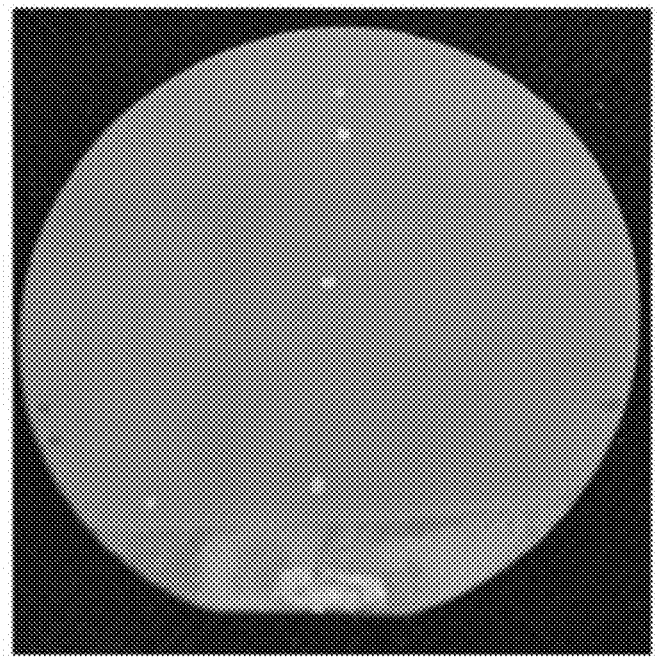
FIG. 5B illustrates the top view structure of the conventional light emitting device.

FIGS. 4A to 4C illustrate the structure of another optoelectronic device of the third embodiment in the present disclosure. As FIG. 4A shows, it can include two layers of the first transition layer 1021 formed on the substrate (no shown), a plurality of reflector rod 1023 formed on the top surface of the topper layer of the first transition layer 1021 and a layer of the second transition layer 1022 formed on the first transition layer 1021 and covers the plurality of reflector rod 1023.

As shows in FIG. 4B, at least three layers of the first transition layer 1021 are formed on the substrate (no shown), and a plurality of reflector rod 1023 formed on the top surface of the upmost layer of the first transition layer 1021 and a layer of the second transition layer 1022 formed on the upmost layer of the first transition layer 1021 and covers the plurality of reflector rod 1023.

As FIG. 4C shows, n layers of the first transition layer 1021 can be formed on the substrate (not shown), and a plurality of reflector rod 1023 formed on the top surface of the upmost layer of the first transition layer 1021 and a layer of the second transition layer 1022 formed on the upmost layer of the first transition layer 1021 and covers the plurality of reflector rod 1023 wherein n≧4 to have a better optical effect or decreasing the stress. In this embodiment, each first transition layer 1021 can have at least one hollow component such as pore, void, bore, pinhole, cavity, or at least two hollow components that can link into a mesh or porous structure. The fabricating method, material, size or other character is the same with the embodiment mentioned above. In one embodiment, each of the plurality first transition layers has at least one hollow component with different width and the width of the hollow component closer to the second transition layer is smaller than the width of the hollow component closer to the substrate. In one embodiment, each of the plurality first transition layers has at least one hollow component with different width and the width of the hollow component is decreasing from the hollow component closer to the second transition layer to the hollow component closer to the substrate.

Specifically speaking, the optoelectronic device 100, 100', 200, 200' can be a light-emitting diode (LED), a laser diode (LD), a photoresister, an infared emitter, an organic light-emitting diode, a liquid crystal display, or a solar cell, a photo diode.

The material of the substrate 101 used for growing or supporting the first transition stack 102a can be a conductive substrate, a non-conductive substrate, transparent or non-transparent substrate. The material of the conductive substrate can be germanium (Ge), gallium arsenide (GaAs), indium phosphide (InP), silicon carbide (SiC), silicon (Si), lithium aluminium oxide (LiAlO$_2$), zinc oxide (ZnO), gallium nitride (GaN), aluminum nitride (AlN) and metal. The transparent substrate can be sapphire, lithium aluminium oxide (LiAlO$_2$), zinc oxide (ZnO), gallium nitride (GaN), aluminum nitride (AlN), glass, diamond, CVD diamond, diamond-like carbon (DLC), spinel (MgAl$_2$O$_4$), aluminium oxide (Al$_2$O$_3$), silicon oxide (SiO$_x$), and Lithium Dioxogallate (LiGaO$_2$).

In accordance with the embodiments in the application, the first conductivity type layer 103 and the second conductivity type layer 105 are two single-layer structures or two multiple layers structure ("multiple layers" means two or more than two layers) having different electrical properties, polarities, dopants for providing electrons or holes respectively. If the first conductivity type layer 103 and the second conductivity type layer 105 are composed of the semiconductor materials, and the conductivity type can be any two of p-type, n-type, and i-type. The active layer 104 disposed between the first conductivity type layer 103 and the second conductivity type layer 105 is a region where the light energy and the electrical energy could transfer or could be induced to transfer. The device transferring the electrical energy to the light energy can be a light-emitting diode, a liquid crystal display, or an organic light-emitting diode; the device transferring the light energy to the electrical energy can be a solar cell or an optoelectronic diode.

In another embodiment of this application, the optoelectronic device 100, 100', 200, 200' is a light emitting device. The light emission spectrum after transformation can be adjusted by changing the physical or chemical arrangement of one layer or more layers in the semiconductor system. The material of the semiconductor layer can be AlGaInP series, AlGaInN series, or ZnO series. The structure of the active layer 104 can be a single heterostructure (SH), a double heterostructure (DH), a double-side double heterostructure (DDH), or a multi-quantum well (MQW). Besides, the wavelength of the emitted light could also be adjusted by changing the number of the pairs of the quantum well for a MQW structure.

In one embodiment of this application, a buffer layer (not shown) could be optionally formed between the substrate 101 and the first transition stack 102a or between the first conductivity layer 103 and the first transition stack 102a. The buffer layer between two material systems can be used as a buffer system. For the structure of the light-emitting diode, the buffer layer is used to reduce the lattice mismatch between two material systems. On the other hand, the buffer layer could also be a single layer, multiple layers, or a structure to combine two materials or two separated structures where the material of the buffer layer can be organic, inorganic, metal, semiconductor and so on, and the structure can be a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure and so on. The material of the buffer layer can be AlN, GaN or other suitable material. The fabricating method of the buffer layer can be sputter or atomic layer deposition (ALD).

A contact layer (not shown) can also be optionally formed on the second conductivity layer 105. The contact layer is disposed on the side of the second conductivity layer 105 away from the active layer 104. Specifically speaking, the contact layer could be an optical layer, an electrical layer or the combination of the two. An optical layer can change the electromagnetic radiation or the light from or entering the active layer 104. The term "change" here means to change at least one optical property of the electromagnetic radiation or the light. The abovementioned property includes but is not limited to frequency, wavelength, intensity, flux, efficiency, color temperature, rendering index, light field, and angle of view. An electrical layer can change or be induced to change the value, density, or distribution of at least one of the voltage, resistance, current, or capacitance between any pair of the opposite sides of the contact layer. The composition material of the contact layer includes at least one of oxide, conductive oxide, transparent oxide, oxide with 50% or higher transmittance, metal, relatively transparent metal, metal with 50% or higher transmittance, organic material, inorganic material, fluorescent material, phosphorescent material, ceramic, semiconductor, doped semiconductor, and undoped semiconductor. In certain applications, the material of the contact layer is at least one of indium tin oxide (ITO), cadmium tin oxide (CTO), antimony tin oxide, indium zinc oxide, zinc aluminum oxide, and zinc tin oxide. If the material is relatively transparent metal, the thickness is about 0.005 µm-0.6 µm.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. An optoelectronic device comprising:
   a substrate; and
   a first transition stack formed on the substrate comprising a first transition layer formed on the substrate having a hollow component formed inside the first transition layer, a second transition layer formed on the first transition layer, and a reflector rod formed inside the second transition layer.

2. The optoelectronic device of claim 1, wherein the first transition layer is an n-type doped layer with the doping concentration of 1E15-1E19 $cm^{-3}$ and/or the second transition layer is an unintentional doped layer or an undoped layer.

3. The optoelectronic device of claim 1, wherein the width of the hollow component can be 10 nm-2000 nm.

4. The optoelectronic device of claim 1, wherein more than one of the hollow component are formed inside the first transition stack and at least two hollow components form a mesh structure, a porous structure, or a regular array wherein the average distance of the hollow component can be 10 nm-2000 nm and the porosity of the hollow component can be 5-90%.

5. The optoelectronic device of claim 1, further comprising a first conductivity semiconductor layer, an active layer and a second conductivity semiconductor layer formed on the first transition stack wherein the material of the first conductivity semiconductor layer, the active layer and the second conductivity semiconductor layer contains at least one element selected from the group consisting of Al, Ga, In, As, P, and N.

6. The optoelectronic device of claim 1, wherein the width of the hollow component closer to the substrate is larger than the width of the hollow component closer to the second transition layer.

7. The optoelectronic device of claim 1, wherein the transition stack comprising a plurality of the first transition layer and each of the first transition layer having more than one of the hollow component with different width, and the width of the hollow component closer to the second transition layer is smaller than the width of the hollow component closer to the substrate.

8. The optoelectronic device of claim 1, wherein the material of the reflector rod can be non-crystalline material such as ITO, ZnO, nitrides or oxides of Si, Ti, Ta, Zr and the like, or composite material of nitrides or oxides of Si, Ti, Ta, Zr and the like.

9. The optoelectronic device of claim 1, wherein the height of the reflector rod can be 30-300 nm; the width of the reflector rod can be 0.1-10 µm, and the cover ratio of the reflector rod on the first transition layer can be 20%-60%.

10. The optoelectronic device of claim 1, further comprising a plurality of the reflector rods formed irregularly on the first transition layer and inside the second transition layer.

11. A method of fabricating an optoelectronic device comprising:
    providing a substrate; and
    forming a first transition stack on the substrate wherein the first transition stack comprising a first transition layer formed on the substrate having a hollow component formed inside the first transition layer, a second transition layer formed on the first transition layer, and a reflector rod formed inside the second transition layer.

12. The method of fabricating an optoelectronic device of claim 11, wherein the hollow component formed inside the first transition layer is formed by wet etching, electrochemical etching or dry etching.

13. The method of fabricating an optoelectronic device of claim 11, wherein the first transition layer is an n-type doped layer with the doping concentration of 1E15-1E19 $cm^{-3}$ and/or the second transition layer is an unintentional doped layer or an undoped layer.

14. The method of fabricating an optoelectronic device of claim 11, wherein the width of the hollow component can be 10 nm-2000 nm.

15. The method of fabricating an optoelectronic device of claim 11, wherein more than one of the hollow component are formed inside the first transition stack and at least two hollow components form a mesh structure, a porous structure, or a regular array wherein the average distance of the hollow component can be 10 nm-2000 nm and the porosity of the hollow component can be 5-90%.

16. The method of fabricating an optoelectronic device of claim 11, further comprising a first conductivity semiconductor layer, an active layer and a second conductivity semiconductor layer formed on the first transition stack wherein the material of the first conductivity semiconductor layer, the active layer and the second conductivity semiconductor layer contains at least one element selected from the group consisting of Al, Ga, In, As, P, and N.

17. The method of fabricating an optoelectronic device of claim 11, wherein the transition stack comprising a plurality of the first transition layer and each of the first transition layer having more than one of the hollow component with different width, and the width of the hollow component closer to the second transition layer is smaller than the width of the hollow component closer to the substrate.

18. The method of fabricating an optoelectronic device of claim 11, wherein the material of the reflector rod can be non-crystalline material such as ITO, ZnO, nitrides or oxides of Si, Ti, Ta, Zr and the like or composite material of nitrides or oxides of Si, Ti, Ta, Zr and the like.

19. The method of fabricating an optoelectronic device of claim 11, wherein the height of the reflector rod can be 30-300 nm, the width of the reflector rod can be 0.1-10 μm and the cover ratio of the reflector rod on the first transition layer can be 20%-60%.

20. The method of fabricating an optoelectronic device of claim 11, further comprising forming a plurality of the reflector rod irregularly on the first transition layer and inside the second transition layer.

* * * * *